(12) United States Patent
Saxler et al.

(10) Patent No.: US 8,946,777 B2
(45) Date of Patent: Feb. 3, 2015

(54) NITRIDE-BASED TRANSISTORS HAVING LATERALLY GROWN ACTIVE REGION AND METHODS OF FABRICATING SAME

(75) Inventors: Adam William Saxler, Durham, NC (US); Scott Sheppard, Chapel Hill, NC (US); Richard Peter Smith, Carrboro, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/564,473

(22) Filed: Sep. 22, 2009

(65) Prior Publication Data

US 2010/0012952 A1 Jan. 21, 2010

Related U.S. Application Data

(63) Continuation of application No. 10/899,215, filed on Jul. 26, 2004, now abandoned.

(51) Int. Cl.
| | |
|---|---|
| H01L 31/0328 | (2006.01) |
| H01L 29/778 | (2006.01) |
| H01L 29/66 | (2006.01) |
| H01L 29/20 | (2006.01) |

(52) U.S. Cl.
CPC ...... *H01L 29/7787* (2013.01); *H01L 29/66462* (2013.01); *H01L 29/2003* (2013.01)
USPC ............................ 257/194; 257/192; 257/243

(58) Field of Classification Search
USPC ................... 257/192, 194, 243; 438/285, 590
See application file for complete search history.

(56) References Cited

U.S. PATENT DOCUMENTS

| | | | |
|---|---|---|---|
| 4,424,525 A | 1/1984 | Mimura |
| 4,471,366 A | 9/1984 | Delagebeaudeuf et al. |
| 4,727,403 A | 2/1988 | Hilda et al. |
| 4,755,867 A | 7/1988 | Cheng |
| 4,788,156 A | 11/1988 | Stoneham et al. |
| 4,946,547 A | 8/1990 | Palmour et al. |

(Continued)

FOREIGN PATENT DOCUMENTS

| | | |
|---|---|---|
| EP | 0 334 006 A1 | 9/1989 |
| EP | 0 563 847 A2 | 10/1993 |

(Continued)

OTHER PUBLICATIONS

Official Action, Japanese Patent Application No. 2007-523541, Nov. 15, 2011.

(Continued)

*Primary Examiner* — Ori Nadav
(74) *Attorney, Agent, or Firm* — Myers Bigel Sibley & Sajovec

(57) ABSTRACT

High electron mobility transistors and/or methods of fabricating high electron mobility transistors that include a first Group III-nitride layer having vertically grown regions, laterally grown regions and a coalescence region are provided. A Group III-nitride channel layer is provided on the first Group III-nitride layer and a Group III-nitride barrier layer is provided on the Group III-nitride channel layer. A drain contact, a source contact and a gate contact are provided on the barrier layer. The gate contact is disposed on a portion of the barrier layer on a laterally grown region of the first Group III-nitride layer and at least a portion of one of the source contact and/or the drain contact is disposed on a portion of the barrier layer on a vertically grown region of the first Group III-nitride layer.

21 Claims, 11 Drawing Sheets

(56) References Cited

U.S. PATENT DOCUMENTS

| | | | |
|---|---|---|---|
| 5,053,348 A | 10/1991 | Mishra et al. | |
| 5,172,197 A | 12/1992 | Nguyen et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,292,501 A | 3/1994 | Degenhardt et al. | |
| 5,296,395 A | 3/1994 | Khan et al. | |
| 5,298,445 A | 3/1994 | Asano | |
| RE34,861 E | 2/1995 | Davis et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,534,462 A | 7/1996 | Fiordalice et al. | |
| 5,592,501 A | 1/1997 | Edmond et al. | 372/45 |
| 5,686,737 A | 11/1997 | Allen | |
| 5,700,714 A | 12/1997 | Ogilhara et al. | |
| 5,701,019 A | 12/1997 | Matsumoto et al. | |
| 5,705,827 A | 1/1998 | Baba et al. | |
| 5,804,482 A | 9/1998 | Konstantinov et al. | |
| 5,885,860 A | 3/1999 | Weitzel et al. | |
| 5,946,547 A | 8/1999 | Kim et al. | |
| 5,990,531 A | 11/1999 | Taskar et al. | |
| 6,015,979 A | 1/2000 | Sugiura et al. | 257/86 |
| 6,028,328 A | 2/2000 | Riechert et al. | |
| 6,046,464 A | 4/2000 | Schetzina | |
| 6,051,849 A | 4/2000 | Davis et al. | |
| 6,064,082 A | 5/2000 | Kawai et al. | |
| 6,086,673 A | 7/2000 | Molnar | |
| 6,150,680 A | 11/2000 | Eastman et al. | |
| 6,177,359 B1 * | 1/2001 | Chen et al. | 438/751 |
| 6,177,685 B1 | 1/2001 | Teraguchi et al. | |
| 6,177,688 B1 | 1/2001 | Linthicum et al. | |
| 6,218,680 B1 | 4/2001 | Carter, Jr. et al. | |
| 6,255,198 B1 | 7/2001 | Linthicum et al. | |
| 6,261,929 B1 | 7/2001 | Gehrke et al. | |
| 6,265,289 B1 * | 7/2001 | Zheleva et al. | 438/503 |
| 6,316,793 B1 | 11/2001 | Sheppard | |
| 6,376,339 B2 | 4/2002 | Linthicum et al. | |
| 6,380,108 B1 | 4/2002 | Linthicum et al. | |
| 6,429,467 B1 | 8/2002 | Ando | |
| 6,448,648 B1 | 9/2002 | Boos | |
| 6,462,355 B1 | 10/2002 | Linthicum et al. | |
| 6,486,042 B2 | 11/2002 | Gehrke et al. | |
| 6,489,221 B2 | 12/2002 | Gehrke et al. | |
| 6,492,669 B2 | 12/2002 | Nakayama et al. | |
| 6,500,257 B1 * | 12/2002 | Wang et al. | 117/95 |
| 6,515,316 B1 | 2/2003 | Wojtowicz et al. | |
| 6,521,514 B1 | 2/2003 | Gehrke et al. | |
| 6,545,300 B2 | 4/2003 | Gehrke et al. | |
| 6,548,333 B2 | 4/2003 | Smith | |
| 6,570,192 B1 | 5/2003 | Davis et al. | |
| 6,582,906 B1 | 6/2003 | Cao et al. | |
| 6,582,986 B2 * | 6/2003 | Kong et al. | 438/48 |
| 6,586,778 B2 | 7/2003 | Linthicum et al. | |
| 6,586,781 B2 | 7/2003 | Wu et al. | |
| 6,602,763 B2 | 8/2003 | Davis et al. | |
| 6,602,764 B2 | 8/2003 | Linthicum et al. | |
| 6,608,327 B1 | 8/2003 | Davis et al. | |
| 6,621,148 B2 | 9/2003 | Linthicum et al. | |
| 6,639,255 B2 | 10/2003 | Inoue et al. | |
| 6,686,261 B2 | 2/2004 | Gehrke et al. | |
| 6,706,114 B2 | 3/2004 | Mueller | |
| 6,855,620 B2 * | 2/2005 | Koike et al. | 438/481 |
| 6,855,959 B2 | 2/2005 | Yamaguchi et al. | 257/98 |
| 7,084,441 B2 | 8/2006 | Saxler | 257/243 |
| 7,141,444 B2 * | 11/2006 | Koike et al. | 438/34 |
| 7,462,867 B2 * | 12/2008 | Tezen | 257/79 |
| 2001/0015446 A1 | 8/2001 | Inoue et al. | |
| 2001/0020700 A1 | 9/2001 | Inoue et al. | |
| 2001/0023964 A1 | 9/2001 | Wu et al. | |
| 2001/0040246 A1 | 11/2001 | Ishii | |
| 2002/0008241 A1 | 1/2002 | Edmond et al. | |
| 2002/0066908 A1 | 6/2002 | Smith | |
| 2002/0079508 A1 | 6/2002 | Yoshida | |
| 2002/0119610 A1 | 8/2002 | Nishii et al. | |
| 2002/0167023 A1 | 11/2002 | Charvarkar et al. | |
| 2003/0017683 A1 | 1/2003 | Emrick et al. | |
| 2003/0020092 A1 | 1/2003 | Parikh et al. | |
| 2003/0102482 A1 | 6/2003 | Saxler | |
| 2003/0119239 A1 * | 6/2003 | Koike et al. | 438/200 |
| 2003/0123829 A1 | 7/2003 | Taylor | |
| 2003/0134446 A1 * | 7/2003 | Koike et al. | 438/41 |
| 2003/0145784 A1 | 8/2003 | Thompson et al. | |
| 2003/0157776 A1 | 8/2003 | Smith | |
| 2003/0213975 A1 | 11/2003 | Hirose et al. | |
| 2004/0004223 A1 | 1/2004 | Nagahama et al. | |
| 2004/0021152 A1 | 2/2004 | Nguyen et al. | |
| 2004/0029330 A1 | 2/2004 | Hussain et al. | |
| 2004/0061129 A1 | 4/2004 | Saxler et al. | |
| 2004/0241970 A1 | 12/2004 | Ring | |
| 2005/0263778 A1 | 12/2005 | Hata et al. | 257/79 |
| 2007/0029643 A1 * | 2/2007 | Johnson et al. | 257/651 |

FOREIGN PATENT DOCUMENTS

| | | |
|---|---|---|
| JP | 10-050982 | 2/1998 |
| JP | 11261053 | 9/1999 |
| JP | 2001230407 A | 8/2001 |
| JP | 2002016087 A | 1/2002 |
| JP | 2003178976 | 6/2003 |
| JP | 2004-342810 | 12/2004 |
| WO | WO 93/23877 A1 | 11/1993 |
| WO | WO 01/57929 A1 | 8/2001 |
| WO | WO 03/049193 A1 | 6/2003 |
| WO | WO 2004/008495 | 1/2004 |

OTHER PUBLICATIONS

Beaumont, B. et al., "Epitaxial Lateral Overgrowth of GaN," *Phys. Stat. Sol.* (b) 227, No. 1, pp. 1-43 (2001).

International Search Report corresponding to PCT/US2005/010869, mailed Jun. 14, 2005.

Ando et al., "10-W/mm AlGaN—GaN HFET With a Field Modulating Plate," *IEEE Electron Device Letters*, 24(5), pp. 289-291 (May 2003).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chini et al., "Power and Linearity Characteristics of Field-Plagted Recessed-Gate AlGaN—GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys.* 33:775-778 (1994).

Coffie et al., Unpassivated p-GaN/AlGaN/GaN HEMTs with 7.1 W/MMF at 10 GHz, *Electronic Letters online* No. 20030872, 39(19), (Sep. 18, 2003).

Gaska et al., "Self-Heating in High-Power AlGaN/GaN HFET's," *IEEE Electron Device Letters*, 19(3), pp. 89-91 (Mar. 1998).

Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE-International (Dec. 2004).

Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N—SiC Substrate for Wireless Base Station Applications," *Electron Devices Meeting*, 2004, pp. 799-802, IEDM Technical Digest. IEEE International (Dec. 2004).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kashahara et al., "Ka-ban 2.3W Power AlGaN/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Küsters at al., "Double-Heterojunction Lattice-Matched and Pseudomorphic InGaAs HEMT with δ-Doped InP Supply Layers

(56) References Cited

OTHER PUBLICATIONS and p-InP Barrier Enhancement Layer Grown by LP-MOVPE," *IEEE Electron Device Letters*, 14(1), (Jan. 1993).

Manfra et al., "Electron Mobility Exceeding 160 000 $cm^2$ /V s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Saxler et al., "III-Nitride Heterostructures on High-Purity Semi-Insulating 4H-SiC Substrates for High-Power RF Transistors," International Workshop on Nitride Semiconductors (Jul. 19, 2004).

Shiojima et al., "Improved Carrier Confinement by a Buried p-Layer in the AlGaN/GaN HEMT Structure," *IEICE Trans. Electron.*, E83-C(12), (Dec. 2000).

"Thick AlN template on SiC substrate—Novel semi insulating substrate for GaN-based devices," © 2003 by TDI, Inc., http://www.tdii.com/products/AlN_SiCT.html.

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled "Improved Dielectric Passivation for Semiconductor Devices," U.S. Appl. No. 10/851,507, filed May 22, 2004.

United States Patent Application entitled "Silicon Carbide on Diamond Substrates and Related Devices and Methods," U.S. Appl. No. 10/707,898, filed Jan. 22, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Binary Group III-Nitride Based High Electron Mobility Transistors and Methods of Fabricating Same," U.S. Appl. No. 11/118,675, filed Apr. 29, 2005.

United States Patent Application entitled "Composite Substrates of Conductive and Insulating or Semi-Insulating Group III-Nitrides for Group III-Nitride Devices," U.S. Appl. No. 11/103,127, filed Apr. 11, 2005.

United States Patent Application entitled "Thick Semi-Insulating or Insulating Epitaxial Gallium Nitride Layers and Devices Incorporating Same," U.S. Appl. No. 11/103,117, filed Apr. 11, 2005.

United States Patent Application entitled "Cap Layers and/or Passivation Layers for Nitride-Based Transistors, Transistor Structures and Methods of Fabricating Same," U.S. Appl. No. 10/996,249, filed Nov. 23, 2004.

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al., "Linearity Performance of GaN HEMTs With Field Plates," DRC 2004, Cree, Inc.

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

Asbeck et al. "Piezoelectric charge densities in AlGaN/GaN HFETs," *Elecronics Letters*. vol. 33, No. 14, pp. 1230-1231 (1997).

Ben-Yaacov et al., "AlGaN/GaN Current Aperture Vertical Electron Transistors with Regrown Channels," *Journal of Applied Physics*. vol. 95, No. 4, pp. 2073-2078 (2004).

Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Burm et al. "Recessed Gate GaN MODFETS," *Solid-State Electronics*. vol. 41, No. 2, pp. 247-250 (1997).

Burm et al. "Ultra-Low Resistive Ohmic Contacts on *n*-GaN Using Si Implantation," *Applied Physics Letters*. vol. 70, No. 4, 464-66 (1997).

Chen et al. "Cl2 reactive ion etching for gate recessing of AlGaN/GaN field-effect transistors," *J. Vac. Sci. Technol. B*. vol. 17, No. 6, pp. 2755-2758 (1999).

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices*. vol. 48, No. 3, pp. 479-485 (Mar. 2001).

Egawa et al. "Recessed gate AlGaN/GaN MODFET on Sapphire Grown by MOCVD," *Applied Physics Letters*. vol. 76, No. 1, pp. 121-123 (Jan. 2000).

Gaska et al. "High-Temperature Performance of AlGaN/GaN HFET's on SiC Substrates," *IEEE Electron Device Letters*. vol. 18, No. 1, pp. 492-494 (Oct. 1997).

Gaska et al. "Electron Transport in AlGaN/GaN Heterostructures Grown on 6H-SiC Substrates," *Applied Physics Letters*. vol. 72, No. 6, pp. 707-709 (Feb. 1998).

Gelmont et al. "Monte Carlo simulation of electron transport in gallium nitride," *Journal of Applied Physics*. vol. 74, No. 3, pp. 1818-1821 (Aug. 1993).

Gradecak, "Microscopic Evidence of Point Defect Incorporation in Laterally Overgraon GaN," *Applied Physics Letters*. vol. 80, No. 16, pp. 2866-2868 (2002).

Heikman et al. "Polarization Effects in AlGaN/GaN and GaN/AlGaN/GaN heterostructures," *Journal of Applied Physics*. vol. 93, No. 12, pp. 10114-10118 (Jun. 2003).

Heikman et al., "Growth of Fe-Doped Semi-insulating GaN by Metalorganic Chemical Vapor Deposition," *Applied Physics Letters*. vol. 83, No. 1, pp. 439-441 (Jul. 2002).

Heikman, Sten J., *MOCVD Growth Technologies for Applications in AlGaN/GaN High Electron Mobility Transistors*, Dissertation, University of California—Santa Barbara, Sep. 2002, 190 pages.

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Karmalkar et al. "Resurf AlGaN/GaN HEMT for High Voltage Power Switching," *IEEE Electron Device Letters*. vol. 22, No. 8, pp. 373-375 (Aug. 2001).

Kaschner et al., Micro-Raman and Cathodoluminescense Studies of Epitaxial Laterally Overgrown GaN with Tungsten Masks: A Method to Map the Free-Carrier Concentration of Thick GaN Samples, *Applied Physics Letters*. vol. 76, No. 23, pp. 3418-3420 (2000).

Kuzmik et al. "Annealing of Schottky contacts deposited on dry etched AlGaN/Gan," *Semiconductor Science and Technology*. vol. 17, No. 11 (Nov. 2002).

(56) References Cited

OTHER PUBLICATIONS

Neuburger et al. "Design of GaN-based Field Effect Transistor Structures based on Doping Screening of Polarization Fields," WA 1.5, 7th Wide-Gandgap III-Nitride Workshop (Mar. 2002).

Ping et al. "DC and Microwave Performance of High-Current AlGaN/GaN Heterostructure Field Effect Transistors Grown on p-Type SiC Substrates," *IEEE Electron Device Letters.* vol. 19, No. 2, pp. 54-56 (Feb. 1998).

Sheppard et al. "High Power Demonstration at 10 GHz with GaN/AlGaN HEMT Hybrid Amplifiers." Presented at the 58th DRC, Denver, CO, Jun. 2000.

Sheppard et al. "Improved 10-GHz Operation of GaN/AlGaN HEMTs on Silicon Carbide," *Materials Science Forum.* vols. 338-342, pp. 1643-1646, (2000).

Shen et al., "High-Power Polarization-Engineered GaN/AlGaN/GaN HEMTs Without Surface Passivation," *IEEE Electronics Device Letters.* vol. 25, No. 1, pp. 7-9 (2004).

Sriram et al. "RF Performance of AlGaN/GaN MODFET's on High Resistivity SiC Substrates," Presentation at Materials Research Society Fall Symposium, 1997.

Sriram et al. "SiC and GaN Wide Bandgap Microwave Power Transistors," *IEEE Sarnoff Symposium*, Pittsburgh, PA, Mar. 18, 1998.

Sullivan et al. "High-Power 10-GHz Operation of AlGaN HFET's on Insulating SiC," *IEEE Electron Device Letters.* vol. 19, No. 6, pp. 198-200 (Jun. 1998).

Wagner et al. "Influence of the Carrier Gas Composition on Morphology, Dislocations, and Microscopic Luminescence Properties of Selectively Grown GaN by Hydride Vapor Phase Epitaxy," *Journal of Applied Physics.* vol. 92, No. 3, pp. 1307-1316 (2002).

Wu et al. "30-W/mm GaN HEMTs by Field Plate Optimization," *IEEE Electron Device Letters.* vol. 25, No. 3, pp. 117-119 (Mar. 2004).

Wu et al. "High Al-Content AlGaN/GaN MODFET's for Ultrahigh Performance," *IEEE Electron Device Letters.* vol. 19, No. 2, pp. 50-53 (Feb. 1998).

Yu et al. "Schottky barrier engineering in III-V nitrides via the piezoelectric effect," *Applied Physics Letters.* vol. 73, No. 13, pp. 1880-1882, (Sep. 1998).

United States Patent Application entitled "Co-Doping for Fermi Level Control in Semi-Insulating Group III Nitrides," filed Jan. 7, 2004.

United States Patent Application entitled "Nitride Heterojunction Transistors Having Charge-Transfer Induced Energy Barriers and Methods of Fabricating the Same," U.S. Appl. No. 10/772,882, filed Feb. 5, 2004.

United States Patent Application entitled "Nitride-Based Transistors with a Protective Layer and a Low-Damage Recess and Methods of Fabrication Thereof," U.S. Appl. No. 10/758,871, filed Jan. 16, 2004.

United States Patent Application entitled "Methods of Fabricating Nitride-Based Transistors with a Cap Layer and a Recessed Gate," filed Jul. 23, 2004.

United States Patent Application entitled "Nitride-Based Transistors and Methods of Fabrication Thereof Using Non-Etched Contact Recesses," U.S. Appl. No. 10/617,843, filed Jul. 11, 2003.

United States Patent Application entitled "Semiconductor Devices Having a Hybrid Channel Layer, Current Aperture Transistors and Methods of Fabricating the Same," U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

Parikh et al. "Development of Gallium Nitride Epitaxy and Associated Material Device Correlation for RF, Microwave and MM-wave Applications," Cree, Inc. (35 slides) May 12, 2004.

Wu et al., "3.5 Watt AlGaN/GaN HEMTs and Amplifiers at 35 GHz," Cree Santa Barbara Technology Center, Goleta, CA 93117, Dec. 2003.

Wu et al., "Linearity Performance of GaN HEMTs with Field Plates," Cree Santa Barbara Technology Center, Goleta, CA 39117, Jun. 21, 2004.

Heikman et al., "Mass Transport Regrowth of GaN for Ohmic Contacts to AlGaN/GaN," *Applied Physics Letters*, vol. 78, No. 19, pp. 2876, May 7, 2001.

United States Patent Application entitled, "Silicon Carbide on Diamond Substrates and Related Devices and Methods," Jan. 22, 2004.

\* cited by examiner

NITRIDE-BASED TRANSISTORS HAVING LATERALLY GROWN ACTIVE REGION AND METHODS OF FABRICATING SAME

CLAIM OF PRIORITY

This application is a continuation of U.S. patent application Ser. No. 10/899,215, filed on Jul. 26, 2004 now abandoned, the content of which is hereby incorporated herein by reference as if set for in its entirety.

FIELD OF THE INVENTION

The present invention relates to semiconductor devices and, more particularly, to transistors that incorporate nitride-based active layers.

BACKGROUND

The present invention relates to transistors formed of semiconductor materials that can make them suitable for high power, high temperature, and/or high frequency applications. Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of radio frequency (RF) power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN.

HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

SUMMARY

Some embodiments of the present invention provide high electron mobility transistors and/or methods of fabricating high electron mobility transistors that include a first Group III-nitride layer having vertically grown regions, laterally grown regions and a coalescence region. A Group III-nitride channel layer is provided on the first Group III-nitride layer and a Group III-nitride barrier layer is provided on the Group III-nitride channel layer. A drain contact, a source contact and a gate contact are provided on the barrier layer. The gate contact is disposed on a portion of the barrier layer on a laterally grown region of the first Group III-nitride layer and at least a portion of one of the source contact and/or the drain contact is disposed on a portion of the barrier layer on a vertically grown region of the first Group III-nitride layer.

In further embodiments of the present invention, the laterally grown region on which the gate contact is disposed extends toward the drain contact at least as far as a depletion region of a two-dimensional electron gas extends from the gate contact under expected operating conditions. The laterally grown region on which the gate contact is disposed may extend toward the drain contact at least as far as a point where a strength of an electric field is 50% of a strength of an electric field at a drain side edge of the gate contact under expected operating conditions. The laterally grown region on which the gate contact is disposed may extend toward the drain contact at least as far as a point where a strength of an electric field is an order of magnitude less than a strength of an electric field at a drain side edge of the gate contact under expected operating conditions. The laterally grown region on which the gate contact is disposed may extend toward the drain contact at least as far as a point where a strength of an electric field is two orders of magnitude less than a strength of an electric field at a drain side edge of the gate contact under expected operating conditions.

In additional embodiments of the present invention, the laterally grown region on which the gate contact is disposed extends toward the drain contact but not to the drain contact such that the drain contact is disposed on a vertically grown region of the first Group III-nitride layer. Furthermore, the source contact may be disposed on the barrier layer to extend across the coalescence region of the first Group III-nitride layer so as to bridge between two laterally grown regions of the first Group III-nitride layer. The first Group III-nitride layer may be semi-insulating or insulating.

In still further embodiments of the present invention, the laterally grown region on which the gate contact is provided extends from beneath the source contact to beneath the drain contact. In other embodiments of the present invention, the laterally grown region on which the gate contact is provided extends from beneath the gate contact to beneath the drain contact. In additional embodiments, the laterally grown region on which the gate contact is provided may extend from beneath the gate contact toward but not to beneath the drain contact. In some embodiments, the laterally grown region on which the gate contact is provided may extend from beneath the source contact toward but not to beneath the drain contact. In some embodiments of the present invention, the laterally grown region on which the gate contact is provided extends a majority of the distance from source contact to the drain contact.

In some embodiments of the present invention, the laterally grown region on which the gate contact is disposed extends toward the drain contact but not to the drain contact such that the drain contact is disposed on a vertically grown region of the first Group III-nitride layer. In other embodiments, the laterally grown region on which the gate contact is disposed extends to but not beyond the drain contact. In still further embodiments, the laterally grown region on which the gate contact is disposed extends beyond an edge of the drain contact such that at least a portion of the drain contact is disposed on the laterally grown region on which the gate contact is disposed.

In additional embodiments of the present invention, the gate contact is disposed on a first laterally grown region and a second laterally grown region adjacent the first laterally grown region on which the gate contact is disposed extends toward the drain contact but not to the drain contact such that the drain contact is disposed on a vertically grown region of the first Group III-nitride layer. In further embodiments, the gate contact is disposed on a first laterally grown region and a second laterally grown region adjacent the first laterally grown region on which the gate contact is disposed extends to but not beyond the drain contact. In still further embodiments, the gate contact is disposed on a first laterally grown region and a second laterally grown region adjacent the first laterally grown region on which the gate contact is disposed extends beyond an edge of the drain contact such that at least a portion of the drain contact is disposed on the second laterally grown region.

In other embodiments of the present invention, the gate contact is disposed on a first laterally grown region and a second laterally grown region adjacent the first laterally grown region and the second laterally grown region extends toward the drain contact but not to the drain contact such that the drain contact is disposed on a vertically grown region of the first Group III-nitride layer. In further embodiments, the gate contact is disposed on a first laterally grown region and a second laterally grown region adjacent the first laterally grown region and the second laterally grown region extends to but not beyond the drain contact. In some embodiments, the gate contact is disposed on a first laterally grown region and a second laterally grown region adjacent the first laterally grown region and the second laterally grown region extends beyond an edge of the drain contact such that at least a portion of the drain contact is disposed on the second laterally grown region.

In yet further embodiments of the present invention, the gate contact is disposed on a first laterally grown region and a portion of the source contact is disposed on a second laterally grown region adjacent the first laterally grown region. In additional embodiments, the gate contact is disposed on a first laterally grown region and the source contact extends to but not beyond a second laterally grown region adjacent the first laterally grown region. In other embodiments, the gate contact is disposed on a first laterally grown region and the source contact does not extend to a second laterally grown region adjacent the first laterally grown region such that the source contact is disposed on a vertically grown region of the first Group III-nitride layer.

In some embodiments of the present invention, the gate contact is disposed on a first laterally grown region and a second laterally grown region adjacent the first laterally grown region and a portion of the source contact is disposed on the second laterally grown region. In other embodiments, the gate contact is disposed on a first laterally grown region and a second laterally grown region adjacent the first laterally grown region and the source contact extends to but not beyond the second laterally grown region. In still further embodiments, the gate contact is disposed on a first laterally grown region and a second laterally grown region adjacent the first laterally grown region and the source contact does not extend to the second laterally grown region such that the source contact is disposed on a vertically grown region of the first Group III-nitride layer.

In additional embodiments of the present invention, the gate contact is disposed on a first laterally grown region and a second laterally grown region adjacent the first laterally grown region extends from the first laterally grown region toward the drain contact. A portion of the source contact is disposed on the first laterally grown region. In further embodiments, the source contact extends to but not beyond the first laterally grown region. In still further embodiments, the source contact does not extend to the first laterally grown region such that the source contact is disposed on a vertically grown region of the first Group III-nitride layer.

In still further embodiments of the present invention, the transistor further includes a substrate and the first Group III-nitride layer is provided on the substrate. The substrate may include a trench and the laterally grown regions extend over the trench. The substrate may be a silicon carbide substrate and the trench may be aligned perpendicular or parallel to a crystal plane of the silicon carbide substrate. For example, the crystal plane of the silicon carbide substrate may be a plane in the $\{11\bar{2}0\}$ family of planes or the $\{10\bar{1}0\}$ family of planes. A mask layer may be provided in the trench. In other embodiments of the present invention, a mask pattern is provided on the substrate and the laterally grown regions extend over the mask pattern.

In some embodiments of the present invention, the laterally grown regions have substantially vertical growth sidewalls. In other embodiments, the laterally grown regions have trapezoidal growth sidewalls.

In particular embodiments of the present invention, the first Group III-nitride layer includes a gallium nitride layer having deep level impurities therein.

In further embodiments of the present invention, the source contact, the gate contact and the drain contact each include a plurality of contact fingers and the laterally grown regions include a plurality of laterally grown regions separated by vertically grown regions, where a respective gate contact finger is provided on a corresponding one of the plurality of laterally grown regions.

In still further embodiments of the present invention, the trench includes a plurality of trenches, the source contact, the gate contact and the drain contact each include a plurality of contact fingers and a respective gate contact finger is disposed above a corresponding one of the plurality of trenches.

Some embodiments of the present invention provide semiconductor devices and methods of fabricating semiconductor devices that include a silicon carbide die having a Group III-nitride layer thereon, the Group III-nitride layer having at least one vertically grown region and at least one laterally grown region and at least one Group III-nitride transistor on the silicon carbide die. The laterally grown region does not extend substantially beyond a region of the silicon carbide die corresponding to the at least one Group III-nitride transistor.

In further embodiments of the present invention, the at least one Group III-nitride transistor includes a plurality of gate fingers and the laterally grown region includes a plurality of laterally grown regions disposed beneath respective ones of the gate fingers of the at least on Group III-nitride transistor. The at least one Group III-nitride transistor may include a plurality Group-III nitride transistors and the at least one laterally grown region may include a plurality of laterally grown regions corresponding to respective ones of the plurality of Group III-nitride transistors.

In particular embodiments of the present invention, the silicon carbide die is a portion of a silicon carbide wafer. The silicon carbide wafer may include a major flat and the at least one laterally grown region may have a boundary with a vertically grown region that is perpendicular or parallel to the major flat. The at least one Group III-nitride transistor may include a gallium nitride-based high electron mobility transistor (HEMT).

In further embodiments of the present invention, at least one Group III-nitride transistor on the silicon carbide die is provided in a region of the die other than the region of the die with the at least one laterally grown region. At least one capacitor, resistor and/or inductor on the silicon carbide die may be provided in a region of the die other than the region of the die with the at least one laterally grown region.

In additional embodiments of the present invention, the at least one laterally grown region has a boundary with a vertically grown region that is aligned perpendicular or parallel to a crystal plane of the silicon carbide substrate. The crystal plane of the silicon carbide substrate may be a plane in the $\{11\bar{2}0\}$ family of planes or the $\{10\bar{1}0\}$ family of planes.

DETAILED DESCRIPTION OF EMBODIMENTS OF THE INVENTION

Figure 1:
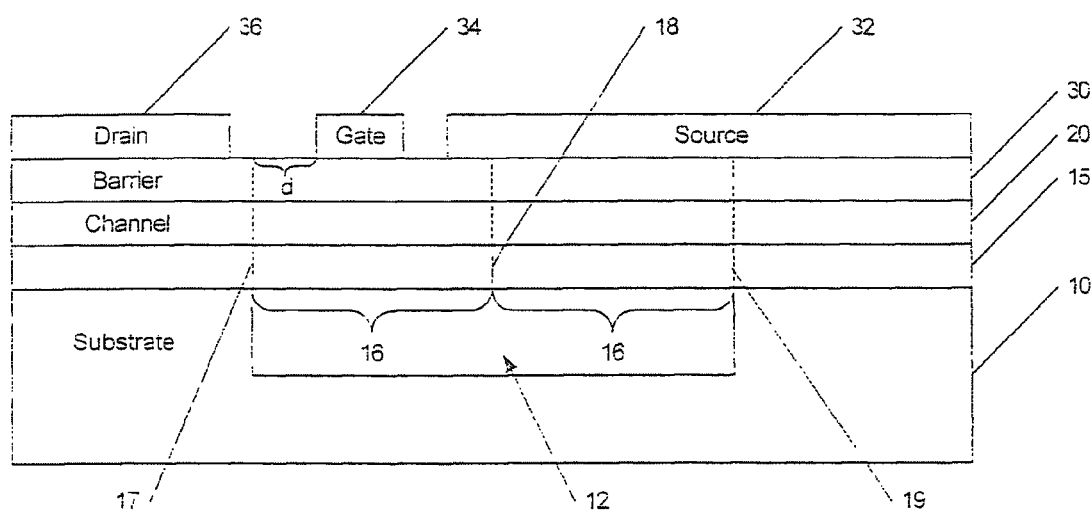
FIG. 1 is a schematic drawing of nitride-based transistors according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Embodiments of the present invention provide Group III-nitride based transistors having a laterally grown active region and methods of forming such transistors.

Embodiments of the present invention may be suited for use in nitride-based HEMTs such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \le x \le 1$ are often used to describe them.

Suitable structures for GaN-based HEMTs that may utilize embodiments of the present invention include but are not limited to those described, for example, in commonly assigned U.S. Pat. No. 6,316,793 and U.S. application Ser. No. 09/904,333 filed Jul. 12, 2001 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER," U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" and/or Shen et al., "High-Power Polarization-Engineered GaN/AlGaN/GaN HEMTs Without Surface Passivation," IEEE Electron Device Letters, Vol. 25, No. 1, pp. 7-9, January 2004, the disclosures of which are hereby incorporated herein by reference in their entirety.

Transistors according to some embodiments of the present invention are schematically illustrated in FIG. 1. As seen in FIG. 1, a substrate 10 is provided on which Group III-nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ $\Omega$-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be the substrate material in some embodiments of the present invention, embodiments of the present invention may utilize any suitable substrate, such as sapphire, aluminum nitride, aluminum gallium nitride, gallium nitride, silicon, GaAs, LGO, ZnO, LAO, InP, diamond and the like or combinations thereof. For example, substrates as described in U.S. patent application Ser. No. 10/707,898 entitled "SILICON CARBIDE ON DIAMOND SUBSTRATES AND RELATED DEVICES AND METHODS," filed Jan. 22, 2004, the disclosure of which is incorporated herein as if set forth in its entirety, could also be utilized. In some embodiments, an appropriate buffer layer also may be formed.

Returning to FIG. 1, a trench 12 is provided in the substrate 10. If a buffer layer is provided, the trench 12 may extend into and/or through the buffer layer(s). A first Group III-nitride layer 15 is provided on the substrate 10 and extending over the trench 12. The first Group III-nitride layer 15 has laterally grown portions 16 that extend over the trench and meet in a coalescence region 18. The laterally grown portions 16 extend from vertically grown portions and begin approximately above the sidewalls of the trench 12 as illustrated by the dashed lines 17 and 19. Thus, the dashed lines 17 and 19 divide vertically grown and laterally grown portions of the first Group III-nitride layer 15. The laterally grown portions 16 of the first Group III-nitride layer 15 may have lower dislocation defect density than the vertically grown portions.

The trench 12 should be deep enough such that the laterally grown regions 16 coalesce before the trench 12 fills such that the laterally grown regions 16 are cantilevered over an opening or cavity. The depth of the trench 12 will, therefore, depend on the width of the trench 12. Furthermore, the width of the trench 12 should be sufficiently wide to provide a laterally grown region 16 having the relationship to the active region, gate contact 34, source contact 32 and/or drain contact 36 as described herein. As used herein, the term "active region" refers to the region between the source contact 32 and the drain contact 36 on which the gate contact 34 is provided. For example, for a GaN layer, in some embodiments of the present invention, the trench may be about 8 µm wide and at least 4 µm deep. Thus, if the lateral and vertical growth rates are approximately the same the cantilevered portions 16 of the first Group III-nitride layer 15 will meet in the coalescence region 18 before low quality, polycrystalline GaN will fill the trench 12. In some embodiments, growth within the trench 12 may be suppressed by forming a mask in the bottom of the trench 12. Furthermore, in cantilevered growth, because a cavity corresponding to the trench 12 remains after formation of the first Group III-nitride layer 15, it may be beneficial to provide as narrow a trench as results in the desired laterally grown region. Such may be the case because, in operation, heat is typically generated in the high field region of the transistor. If the high field region is over a cavity, heat dissipation through the substrate 10 may be reduced.

In some embodiments of the present invention, the trench 12 extends perpendicular or parallel to a crystal plane of the substrate 10. For example, the trench 12 may extend parallel or perpendicular to a plane in the $\{11\bar{2}0\}$ family of planes or the $\{10\bar{1}0\}$ family of planes of a silicon carbide substrate. In particular embodiments of the present invention, the trench 12 extends parallel or perpendicular to a major flat of a silicon carbide wafer that provides the substrate 10. In some embodiments of the present invention, the trench 12 may be oriented with respect to the crystal structure to provide vertical sidewall growth of the laterally grown regions 16 of the first Group III-nitride layer 15. For example, the sidewall growth may be substantially perpendicular to the surface of the substrate 10. In some embodiments of the present invention, the trench 12 may be oriented with respect to the crystal structure to provide trapezoidal sidewall growth of the laterally grown regions 16 of the first Group III-nitride layer 15. For example, the sidewall growth may be oblique to the surface of the substrate 10.

The first Group III-nitride layer 15 may be an insulating or semi-insulating Group-III nitride layer. In some embodiments of the present invention, the first Group III-nitride layer 15 is a gallium nitride based layer, such as a GaN layer, incorporating sufficient deep level dopants to provide insulating behavior. For example, the first Group III-nitride layer 15 may be a GaN layer doped with Fe.

A channel layer 20 is provided on the first Group III-nitride layer 15. The channel layer 20 may be deposited on first Group III-nitride layer 15. The channel layer may be deposited by MOCVD or by other techniques known to those of skill in the art, such as MBE or HVPE. In some embodiments of the present invention, the channel layer 20 is a Group III-nitride, such as $Al_xGa_{1-x}N$ where $0 \leq x \leq 1$, provided that the bandgap of the channel layer 20 is less than the bandgap of the barrier layer 30. In certain embodiments of the present invention, x=0, indicating that the channel layer 20 is GaN. The channel layer 20 may also be other Group III-nitrides such as InGaN, AlInGaN or the like. The channel layer 20 may be undoped ("unintentionally doped"). The channel layer 20 may also be a multi-layer structure, such as a superlattice or combinations of GaN, AlGaN or the like.

A barrier layer 30 is provided on the channel layer 20. The channel layer 20 may have a bandgap that is less than the bandgap of the barrier layer 30. The barrier layer 30 may be deposited on the channel layer 20. In certain embodiments of the present invention, the barrier layer 30 is AlN, AlInN, AlGaN and/or AlInGaN. In some embodiments of the present invention, the barrier layer 30 includes multiple layers. For example, the barrier layer 30 may be about 1 nm of AlN with about 25 nm of AlGaN on the AlN layer. Examples of barrier layers according to certain embodiments of the present invention are described in U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein.

The barrier layer 30 may be a Group III-nitride and has a bandgap larger than that of the channel layer 20. Accordingly, in certain embodiments of the present invention, the barrier layer 30 is AlGaN, AlInGaN and/or AlN or combinations of layers thereof. Other materials may also be used for the barrier layer 30. For example, $ZnGeN_2$, $ZnSiN_2$ and/or $MgGeN_2$ could also be used.

A source contact 32, a gate contact 34 and a drain contact 36 are provided on the barrier layer 30. The gate contact 34 may be a Schottky gate contact. The source contact 32 and drain contact 36 may be ohmic contacts. Materials for and formation of source, drain and gate contacts of Group III-nitride transistors are known to those of skill in the art and, therefore, are not described in detail herein.

The gate contact 34 is provided on the barrier layer 30 in a region that is disposed on a laterally grown portion 16 of the first Group III-nitride layer 15. In some embodiments or the present invention, the laterally grown region 16 on which the gate contact 34 is disposed extends toward the drain contact 36 a distance "d" that is at least as far as a depletion region of a two-dimensional electron gas extends from the edge of the gate contact 34 on the drain side under expected operating conditions. For example, for a gallium nitride based device with a 3.0 μm gap between the gate contact 34 and the drain contact 36, a 0.25 μm long gate contact 34 and a 1.0 μm gap between the gate contact 34 and the source contact 32, the distance "d" may be about 1.5 μm. By placing the gate contact and high field region over portions of the first Group III-nitride layer 15 with lower dislocation defect density, the regions of the layers formed on the laterally grown regions 16 of the first Group III-nitride layer 15 may have lower dislocation density and, therefore, the gate leakage of the device may be reduced. Furthermore, the laterally grown regions 16 may have reduced trapping at dislocation related energy levels in regions above, below and in the active region.

In certain embodiments of the present invention, the laterally grown region 16 on which the gate contact 34 is disposed extends toward the drain contact 36 at least as far as a point where an electric field has a strength at least 50% less than a strength of an electric field at a drain side edge of the gate contact 34 under expected operating conditions. In further embodiments of the present invention, the laterally grown region 16 on which the gate contact 34 is disposed extends toward the drain contact 36 at least as far as a point where an electric field has a strength an order of magnitude less than a strength of an electric field at a drain side edge of the gate contact 34 under expected operating conditions. In certain embodiments of the present invention, the laterally grown region 16 on which the gate contact 34 is disposed extends toward the drain contact 36 at least as far as a point where an electric field has a strength at least two orders of magnitude less than a strength of an electric field at a drain side edge of the gate contact 34 under expected operating conditions.

As is further illustrated in FIG. 1, in some embodiments of the present invention, the laterally grown region 16 on which the gate contact 34 is disposed extends toward the drain contact 36 but not to the drain contact 36 such that the drain contact 36 is disposed on a vertically grown region of the first Group III-nitride layer 15. Furthermore, the source contact 32 may be disposed on the barrier layer 30 to extend across the coalescence region 18 of the first Group III-nitride layer 15 so as to bridge between two laterally grown regions 16 of the first Group III-nitride layer 15.

While the laterally grown regions 16 are shown as extending to a location between the gate contact 34 and the drain contact 36, other configurations may also be utilized. For example, in some embodiments, the laterally grown region 16 on which the gate contact 34 is provided extends from beneath the source contact 32 to beneath the drain contact 36. The laterally grown region 16 on which the gate contact is provided could only extend from beneath the gate contact 34 to beneath the drain contact 36. Alternatively, the laterally grown region 16 on which the gate contact 34 is provided may extend from beneath the gate contact 34 toward but not to beneath the drain contact 36. The laterally grown region on which the gate contact 34 is provided may extend from beneath the source contact 32 toward but not to beneath the drain contact 36. In some embodiments of the present invention, the laterally grown region on which the gate contact 34 is provided extends a majority of the distance from source contact 32 to the drain contact 36.

While embodiments of the present invention have been illustrated in FIG. 1 with reference to cantilevered growth to provide the laterally grown portions 16 extending over the trench 12, in other embodiments of the present invention, epitaxial lateral overgrowth over a mask or pendeo-epitaxial growth from sidewalls of a trench in a Group III-nitride layer may also be provided. Thus, for example, rather than etching a trench in the substrate 10, a mask pattern could be provided on the substrate 10 and the first Group III-nitride layer grown laterally over the mask. However, care may need to be taken in such a case to avoid contamination of the Group III-nitride layer by the mask. For example, if the first Group III-nitride layer is GaN and the mask is $SiO_2$, the silicon from the mask may contaminate the GaN to dope the GaN conductive. However, a mask of diamond or other thermally conductive material could be utilized. Thus, a buried conductive layer could be unintentionally created.

As a further example, if pendeo-epitaxial growth is utilized, a Group III-nitride layer may be provided on the substrate 10 and trenches formed in the Group III-nitride layer.

The laterally grown portions 16 would then be grown from the sidewalls of the trenches in the first Group III-nitride layer.

Techniques for cantilevered growth, pendeo-epitaxial growth and/or epitaxial lateral overgrowth are known to those of skill in the art and need not be described further herein. However, examples of such growth are described, for example, in U.S. Pat. Nos. 6,706,114, 6,686,261, 6,621,148, 6,608,327, 6,602,764, 6,602,763, 6,586,778, 6,582,986, 6,570,192, 6,545,300, 6,521,514, 6,489,221, 6,486,042, 6,462,355, 6,380,108, 6,376,339, 6,261,929, 6,255,198, 6,177,688 and 6,051,849, the disclosures of which are incorporated herein by reference as if set forth fully herein.

Figure 2:
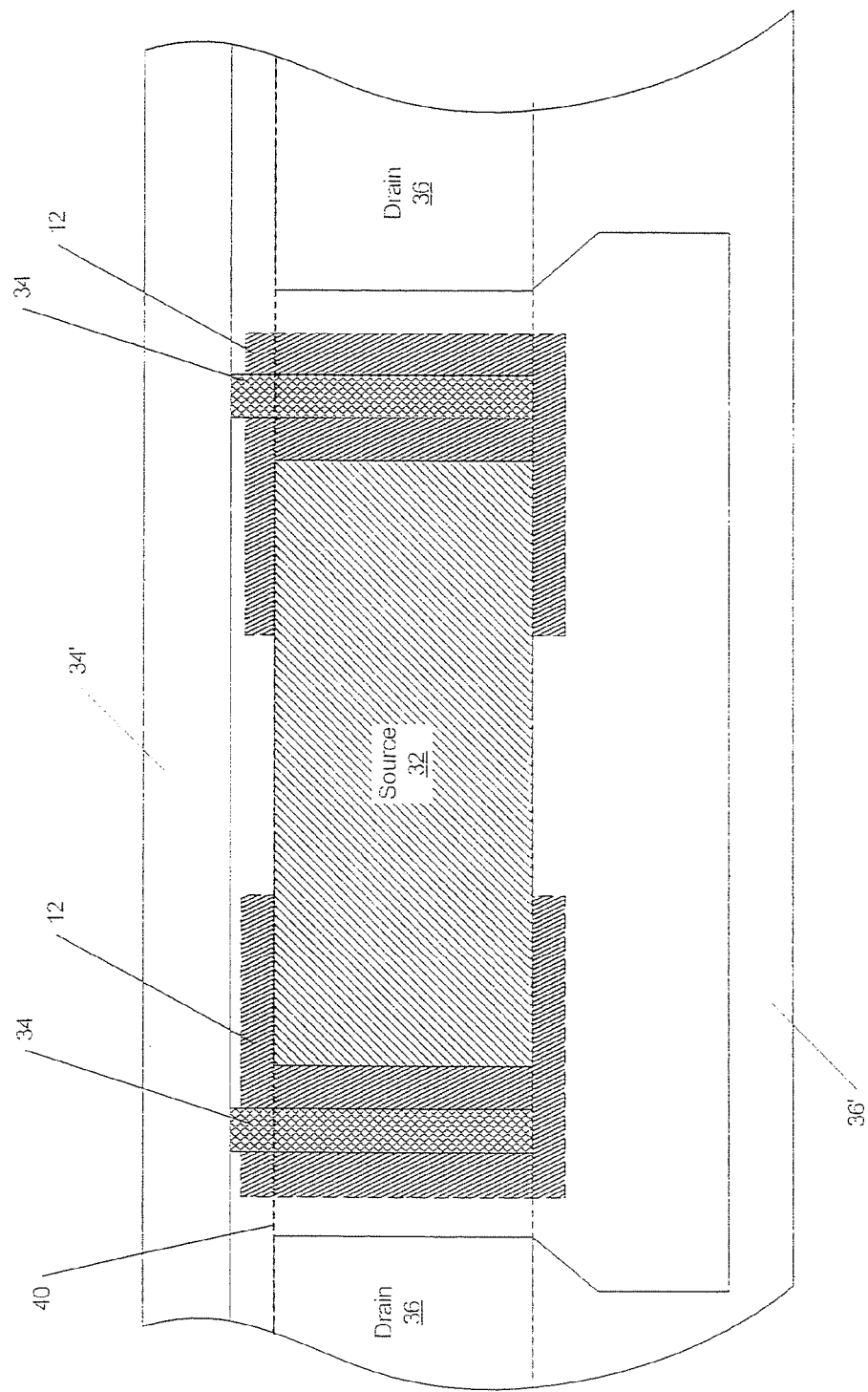
FIG. 2 is a plan view illustration of transistors according to further embodiments of the present invention.

FIG. 2 is a plan view of a portion of a transistor having multiple gate, source and drain fingers according to some embodiments of the present invention. As seen in FIG. 2, a plurality of gate contacts 34 are provided between corresponding source contacts 32 and drain contacts 36. The gate contacts 34 are connected together by a gate metal interconnect 34', the drain contacts 36 are connected together by a drain contact interconnect 36' and the source contacts 32 are connected together in another interconnect metal layer (not shown) utilizing techniques known to those of skill in the art. The active area of the transistor is defined laterally by an isolation edge 40 as shown in FIG. 2, where current flows between the terminals nominally within the region defined by the isolation edge 40. The isolation edge 40 may, for example, be provided by an implanted region or mesa termination. The trenches 12 may extend beyond the isolation edge 40 and may extend beyond the isolation edge 40 a distance sufficient so that edge effects of the lateral growth do not extend substantially into the active region of the device. For example, a distance of several microns may be sufficient.

In some embodiments of the present invention, the trench 12 may be provided in an active device region, such as between the source and drain contacts 32, 36 and extends under the source contact 32 as illustrated in FIG. 2. Thus, the trenches 12 need not be provided in all regions of the substrate 10 but may be limited to regions where the lower dislocation density may provide the most benefit. For example, the trenches 12 could, but need not, extend to beneath the gate interconnect 34' that interconnects the fingers 34 of the gate or to beneath the region of the source or drain interconnects 36' that interconnects the fingers of the source or drain contacts 34, 36. Thus, the trenches 12 may be somewhat wider than the active region but need not be so large as to extend to other areas where, for example, other devices, such as passive devices or discrete devices including, for example, resistors, capacitors or inductors, may be formed.

Figure 3:
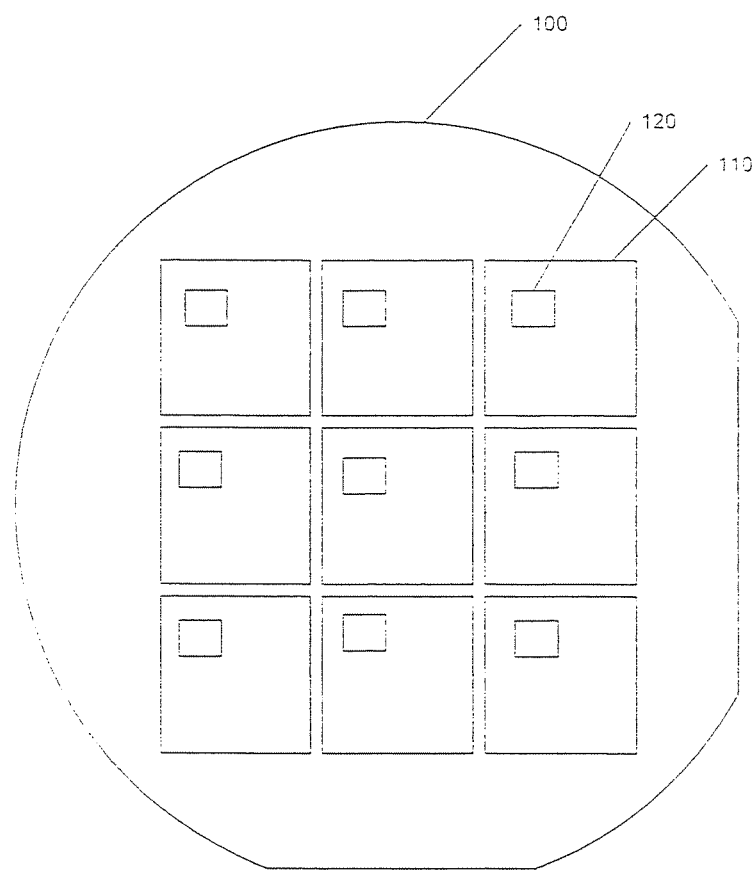
FIG. 3 is a plan view illustration of a wafer including dies according to further embodiments of the present invention.

FIG. 3 is a plan view of a wafer 100 having die 110 according to some embodiments of the present invention. As seen in FIG. 3, the die 110 may have a particular region 120 where trenches are formed to make transistors as described above with reference to FIGS. 1 and/or 2. The region 120 may be less than the entire die 110. Thus, according to some embodiments of the present invention, a silicon carbide die having at least one trench and at least one Group III-nitride transistor on the silicon carbide die is provided. The trench is disposed only in a region of the silicon carbide die corresponding to an active region of the Group III-nitride transistor. Other devices, including other transistors that are not formed on laterally grown regions, may be provided in other regions of the die 110 outside of the region 120. Furthermore, multiple trenches to provide multiple transistors may be provided in the region 120. Also, while the wafer 100 is illustrated as having multiple die 110 that may be subsequently singulated to provide a plurality of chips, in some embodiments, the wafer 100 may be a single die such that the wafer provides the die. Furthermore, multiple regions 120 may be provided in a single die 110.

The trenches in the region 120 of the die 110 may be aligned to the major flat or the minor flat of the wafer 100. In some embodiments of the present invention, the trenches are aligned perpendicular or parallel to the major flat of the wafer 100.

Fabrication of transistors according to some embodiments of the present invention will now be described with reference to FIGS. 4A-4D and FIG. 1. FIGS. 4A-4D and FIG. 1 illustrate fabrication of transistors utilizing cantilevered growth of the first Group III-nitride layer. However, as discussed above, other lateral growth techniques, such as ELO or pendeo-epitaxial growth could also be utilized. Furthermore, fabrication of transistors according to some embodiments of the present invention will be described with reference to a silicon carbide substrate and a GaN first Group III-nitride layer, however, other materials may be utilized as described above. If other materials or growth techniques are utilized, modifications in the fabrication described herein may be needed in light of the different materials and/or growth technique. Such modifications should be apparent those of skill in the art in light of the present disclosure and, therefore, will not be described further herein. For example, as described below, cantilevered growth may be provided for forming the epitaxial layers in-situ in a continuous process in an epitaxial growth reactor by varying the source materials during growth. However, if pendeo-epitaxial growth is utilized, a Group III-nitride layer is first formed on a substrate, removed from the reactor, masked and etched and then returned to the reactor to grow the remaining layers. Thus, the use of cantilevered growth may provide for fewer fabrication steps.

Figure 4A:
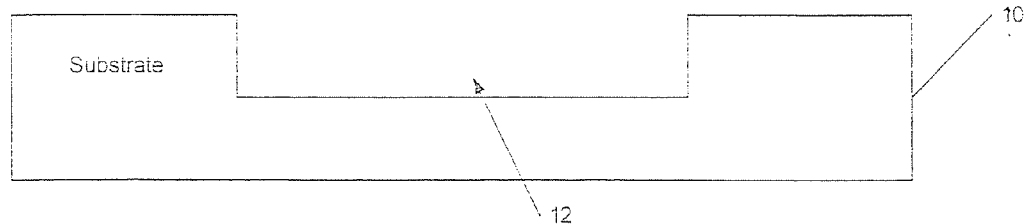
FIGS. 4A-4D are schematic illustrations of fabrication of transistors according to further embodiments of the present invention.

Turning to FIG. 4A, a substrate 10, such as a semi-insulating silicon carbide substrate, has a trench 12 formed therein. The trench 12 may be formed by forming and patterning a mask on the substrate 10, etching the substrate 10 utilizing the patterned mask and, subsequently, removing the patterned mask. For example, a reactive ion etch may be used to etch the substrate 10 if the substrate 10 is silicon carbide. Other etching techniques could also be utilized. As discussed above, the mask may be aligned to the flats of the wafer to assure that the trench is aligned to a crystal plane of the substrate 10. Furthermore, alignment marks may also be etched into the substrate 10 so that subsequent fabrication of, for example, ohmic contacts and/or the gate contact may be aligned to the trench 12. Such alignment marks may be provided in the substrate 10 as the subsequent GaN-based layers may be transparent and, therefore, the alignment marks may be visible through the subsequently formed layers for use in subsequent fabrication steps.

Figure 4B:
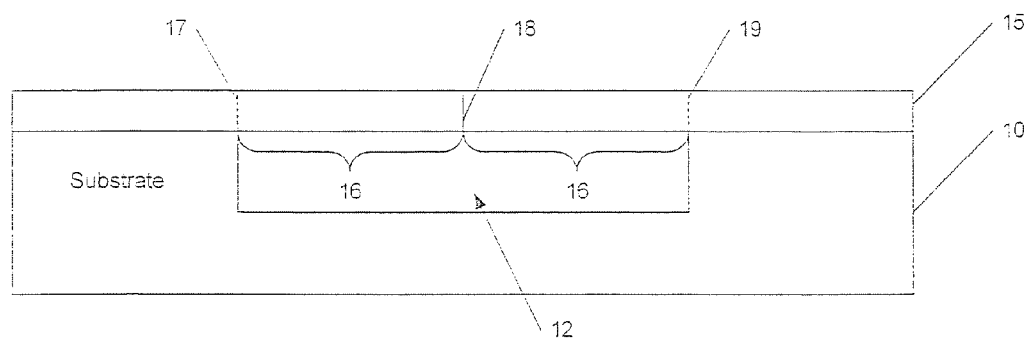

FIG. 4B illustrates the growth of the first Group III-nitride layer 15, such as a GaN layer. Typically, the first layer 15 would be preceded by the deposition of a thin nucleation layer such as AlN in the case of a SiC substrate and a GaN first layer. A GaN layer having insulating properties may be grown, for example, by metal organic chemical vapor deposition (MOCVD) incorporating sufficient deep level dopants, such as Fe, into the layer to provide insulating properties to the GaN layer. Techniques for incorporating deep level dopants are described, for example, in U.S. patent application Ser. No. 10/752,970, entitled "CO-DOPING FOR FERMI LEVEL CONTROL IN SEMI-INSULATING GROUP III NITRIDES" filed Jan. 7, 2004, the disclosure of which is incorporated herein by reference as if set forth fully herein.

Techniques for growing cantilevered Group III-nitrides are discussed above and known to those of skill in the art and, therefore, need not be described further herein.

Figure 4C:
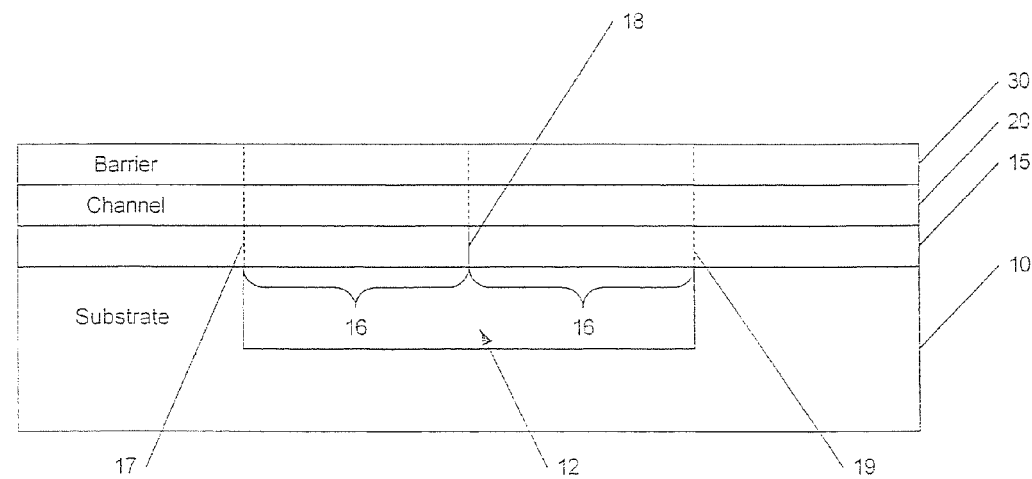

After the first Group III-nitride layer 15 coalesces over the trench 12, the deep level dopant source may be discontinued and the channel layer 20 may be grown on the first Group III-nitride layer 15 as illustrated in FIG. 4C. The coalescence region may not extend into and/or through layers subsequently formed on the first Group III-nitride layer 15. In the example described above, the Fe source may be discontinued and a GaN layer grown on the Fe doped GaN layer in-situ. Likewise, the source materials may be altered and the barrier layer 30 grown on the channel layer 20. For example, Al may be added to the GaN source materials and AlGaN grown as the barrier layer 30. Such layers may be formed by MOCVD as described above. Other growth techniques may also be utilized. Thus, in some embodiments of the present invention, the first Group III-nitride layer 15, the channel layer 20 and the barrier layer 30 may be formed in a continuous process without the need for additional growth, mask and/or etching steps.

Figure 4D:
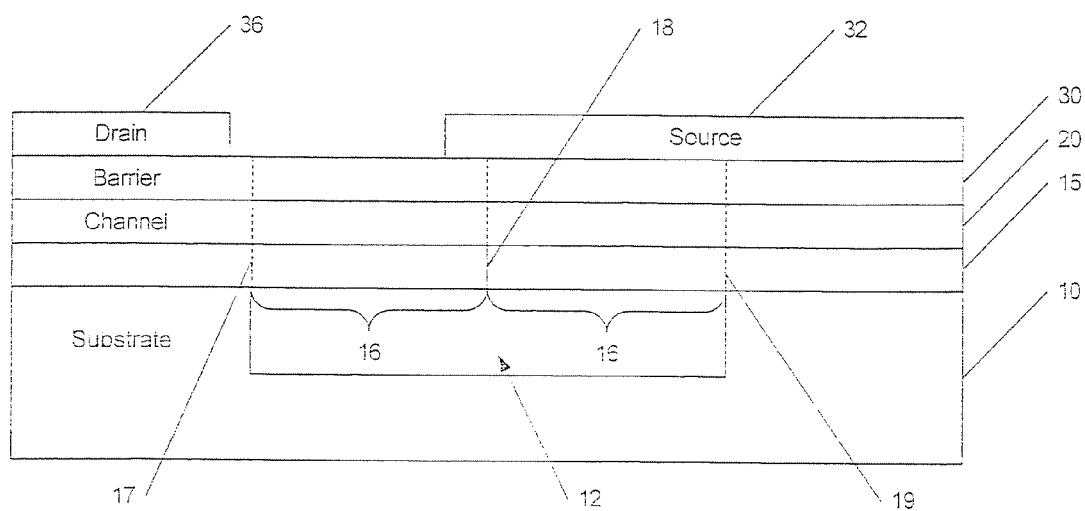

FIG. 4D illustrates the formation of the ohmic contacts for the source contact 32 and the drain contact 36. These contacts may, for example, be formed by depositing and patterning an ohmic contact material utilizing conventional techniques. The particular technique of forming ohmic contacts may depend on the structure of the transistor device. For example, the contacts may be formed in a recess or on a regrown layer. Furthermore, anneals or other processing to form the source contact 32 and the drain contact 36 may be provided. For example, encapsulation layers may be provided to protect the barrier layer 30 from damage during contact anneals. The formation of ohmic contacts for Group III-nitride devices is known to those of skill in the art and, therefore, need not be described further herein. The ohmic contacts may be patterned, for example, utilizing the alignment marks etched in the substrate 10 as described above.

The gate contact 34 may also be formed as illustrated in FIG. 1. The gate contact 34 may, for example, be formed by depositing and patterning a Schottky contact material utilizing conventional techniques. The formation of gate contacts for Group III-nitride devices is known to those of skill in the art and, therefore, need not be described further herein. The gate contact 34 may be patterned, for example, utilizing the alignment marks etched in the substrate 10 as described above.

Any suitable technique for forming the ohmic contacts and the gate contact may be utilized while providing the alignment to the laterally grown regions described herein. For example, techniques and/or structures such as those described in the above referenced United States patents, patent applications and/or publications as well as U.S. patent application Ser. No. 10/849,617, entitled "METHODS OF FABRICATING NITRIDE-BASED TRANSISTORS HAVING REGROWN OHMIC CONTACT REGIONS AND NITRIDE-BASED TRANSISTORS HAVING REGROWN OHMIC CONTACT REGIONS," filed May 20, 2004, U.S. patent application Ser. No. 10/897,726, entitled "METHODS OF FABRICATING NITRIDE-BASED TRANSISTORS WITH A CAP LAYER AND A RECESSED GATE," filed Jul. 23, 2004, U.S. patent application Ser. No. 10/617,843, entitled "NITRIDE-BASED TRANSISTORS AND METHODS OF FABRICATION THEREOF USING NON-ETCHED CONTACT RECESSES," filed Jul. 11, 2003, the disclosures of which are incorporated by reference as if set forth fully herein, may be utilized.

Figure 5:
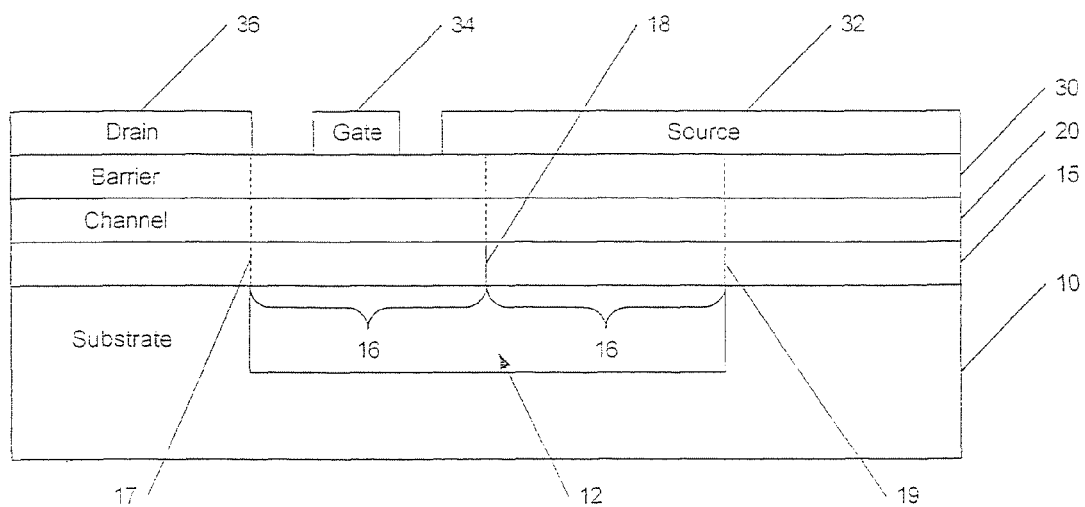
FIGS. 5-15 are schematic drawings of nitride-based transistors according to further embodiments of the present invention.

FIGS. 5 through 15 illustrate different configurations of source contact 32, drain contact 36 and gate contact 34 with reference to the laterally grown regions 16 and coalescence region 18 according to further embodiments of the present invention. In FIG. 5, the drain contact 36 is provided on the vertically grown portion of the first Group III-nitride layer 15 and extends to but not substantially beyond the boundary 17 between the laterally grown region 16 and the vertically grown region of the first Group III-nitride layer 15. Thus, the active region of the device in FIG. 5 is provided in a single laterally grown region 16.

Figure 6:
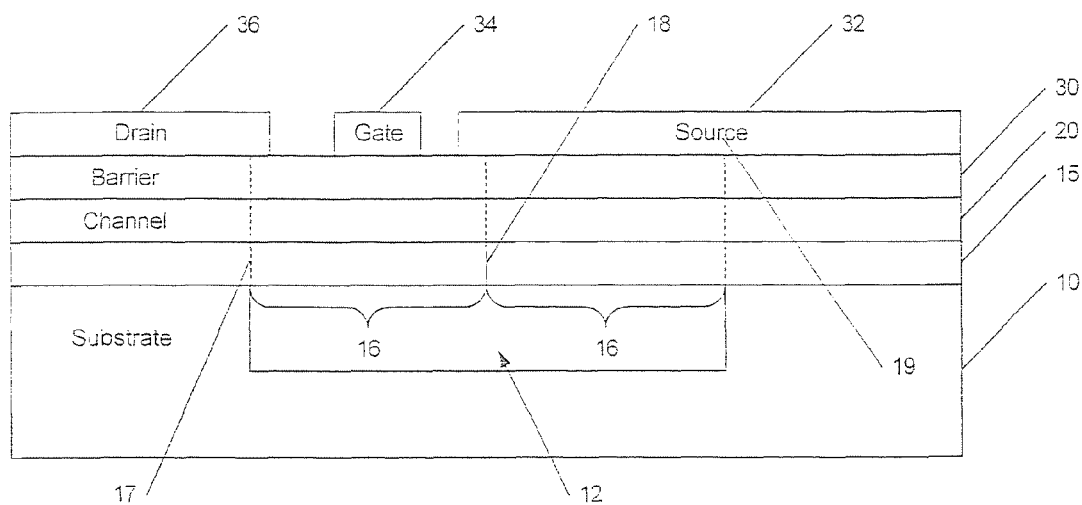

In FIG. 6, the drain contact 36 is provided on the vertically grown portion of the first Group III-nitride layer 15 and extends beyond the boundary 17 between the laterally grown region 16 and the vertically grown region of the first Group III-nitride layer 15. Thus, the active region of the device in FIG. 6 is provided in a single laterally grown region 16.

Figure 7:
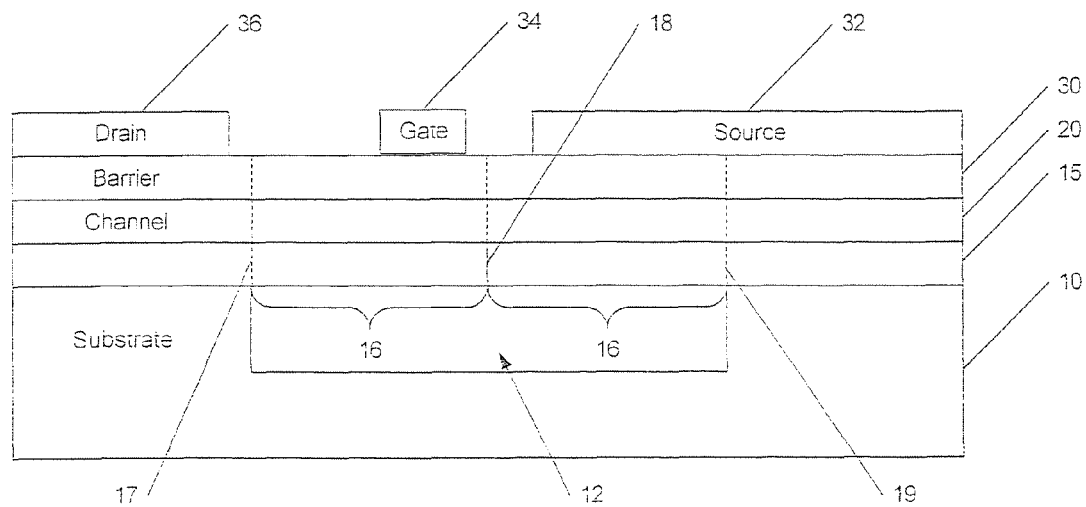

In FIG. 7, the drain contact 36 is provided on the vertically grown portion of the first Group III-nitride layer 15 and does not extend to the boundary 17 between the laterally grown region 16 and the vertically grown region of the first Group III-nitride layer 15. The source contact 32 does not bridge the coalescence region 18. The gate contact 34 is provided on the laterally grown region 16 adjacent the drain contact 36. Thus, the active region of the device in FIG. 7 is provided in two adjacent laterally grown regions 16 and portion of a vertically grown region adjacent one of the laterally grown regions 16.

Figure 8:
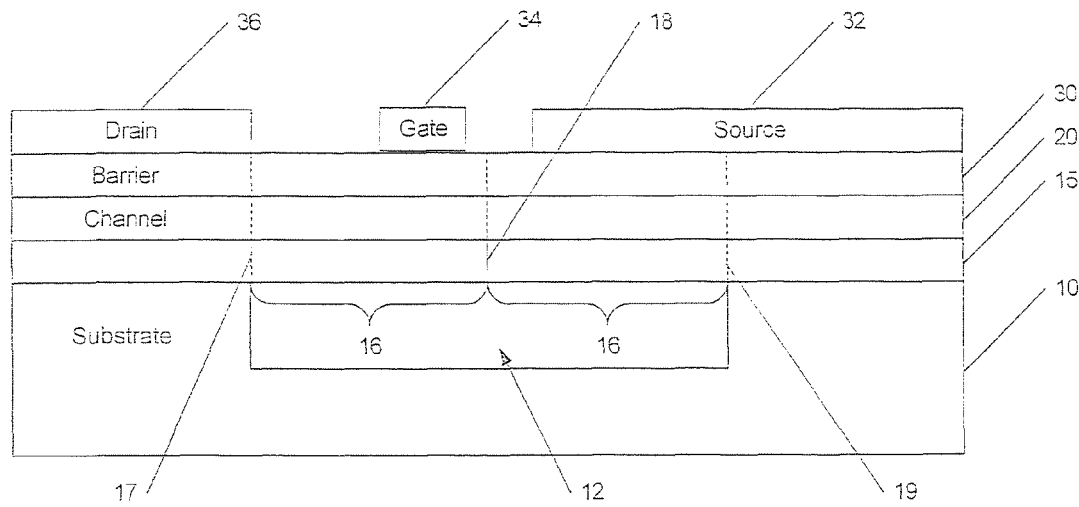

In FIG. 8, the drain contact 36 is provided on the vertically grown portion of the first Group III-nitride layer 15 and extends to but not beyond the boundary 17 between the laterally grown region 16 and the vertically grown region of the first Group III-nitride layer 15. The source contact 32 does not bridge the coalescence region 18. The gate contact 34 is provided on the laterally grown region 16 adjacent the drain contact 36. Thus, the active region of the device in FIG. 8 is provided in two adjacent laterally grown regions 16.

Figure 9:
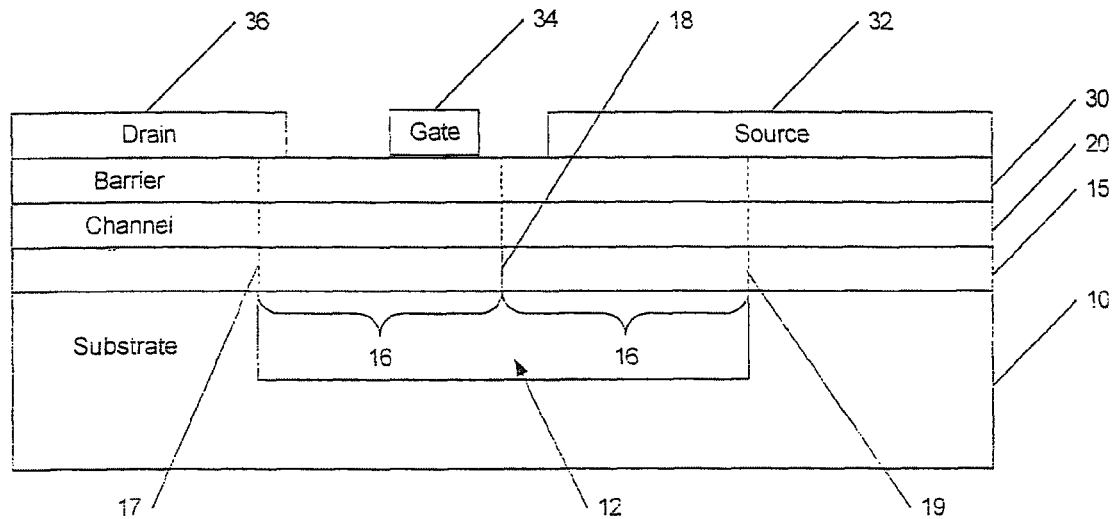

In FIG. 9, the drain contact 36 is provided on the vertically grown portion of the first Group III-nitride layer 15 and extends beyond the boundary 17 between the laterally grown region 16 and the vertically grown region of the first Group III-nitride layer 15. The source contact 32 does not bridge the coalescence region 18. The gate contact 34 is provided on the laterally grown region 16 adjacent the drain contact 36. Thus, the active region of the device in FIG. 9 is provided in two adjacent laterally grown regions 16.

Figure 10:
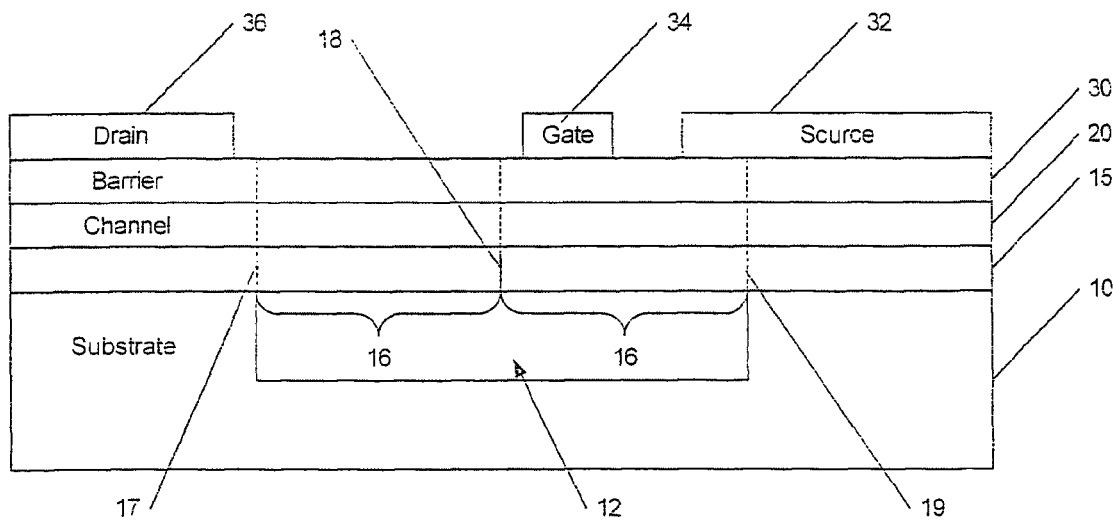

In FIG. 10, the drain contact 36 is provided on the vertically grown portion of the first Group III-nitride layer 15 and does not extend to the boundary 17 between the laterally grown region 16 and the vertically grown region of the first Group III-nitride layer 15. The source contact 32 does not bridge the coalescence region 18. The gate contact 34 is provided on the laterally grown region 16 adjacent the source contact 32. Thus, the active region of the device in FIG. 10 is provided in two adjacent laterally grown regions 16 and portion of a vertically grown region adjacent one of the laterally grown regions 16.

Figure 11:
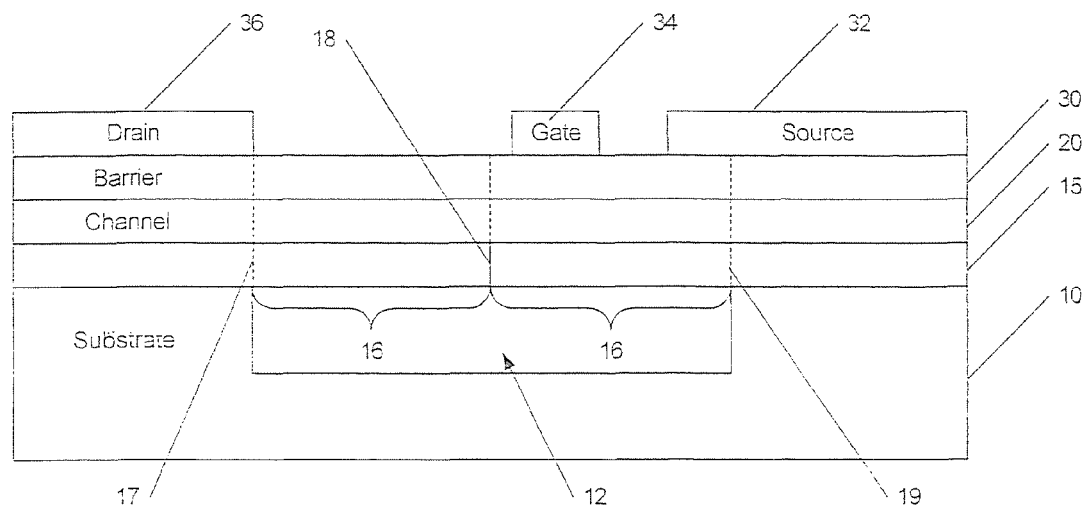

In FIG. 11, the drain contact 36 is provided on the vertically grown portion of the first Group III-nitride layer 15 and extends to but not beyond the boundary 17 between the laterally grown region 16 and the vertically grown region of the first Group III-nitride layer 15. The source contact 32 does not bridge the coalescence region 18. The gate contact 34 is provided on the laterally grown region 16 adjacent the source contact 32. Thus, the active region of the device in FIG. 11 is provided in two adjacent laterally grown regions 16.

Figure 12:
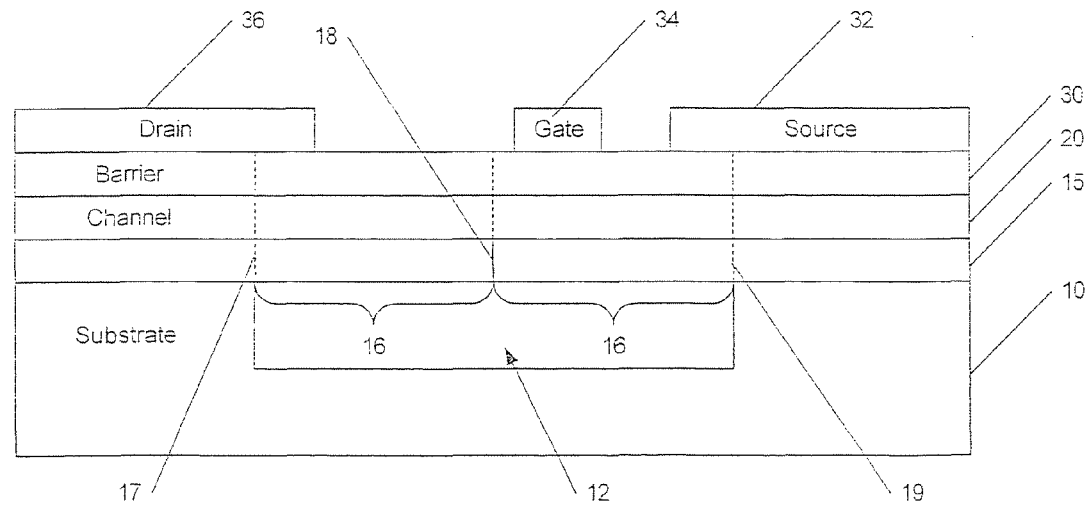

In FIG. 12, the drain contact 36 is provided on the vertically grown portion of the first Group III-nitride layer 15 and extends beyond the boundary 17 between the laterally grown region 16 and the vertically grown region of the first Group III-nitride layer 15. The source contact 32 does not bridge the coalescence region 18. The gate contact 34 is provided on the laterally grown region 16 adjacent the source contact 32. Thus, the active region of the device in FIG. 12 is provided in two adjacent laterally grown regions 16.

Figure 13:
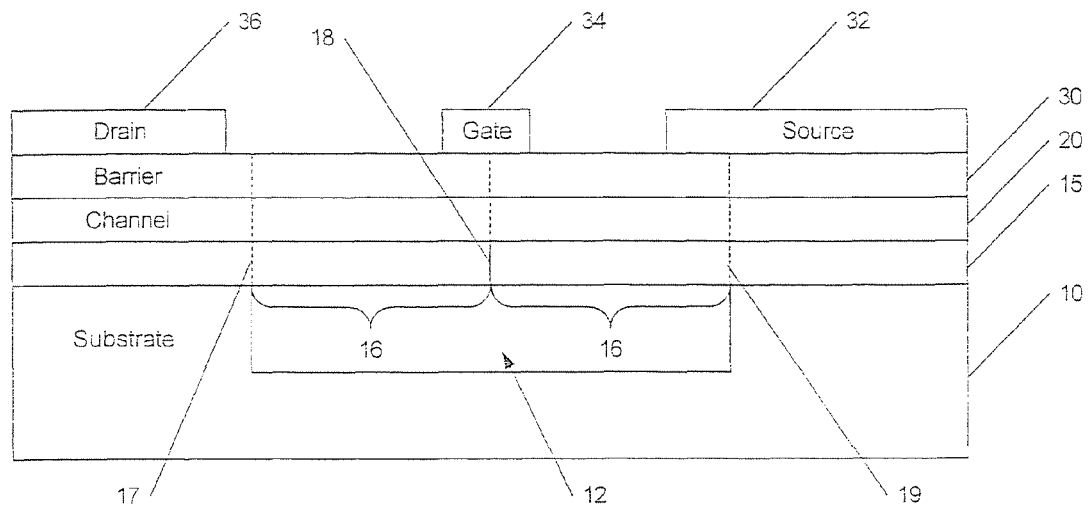

In FIG. 13, the drain contact 36 is provided on the vertically grown portion of the first Group III-nitride layer 15 and does not extend to the boundary 17 between the laterally grown region 16 and the vertically grown region of the first Group III-nitride layer 15. The source contact 32 does not bridge the coalescence region 18. The gate contact 34 is provided on both the laterally grown regions 16 and bridges the coalescence region 18. Thus, the active region of the device in FIG. 13 is provided in two adjacent laterally grown regions 16 and portion of a vertically grown region adjacent one of the laterally grown regions 16.

Figure 14:
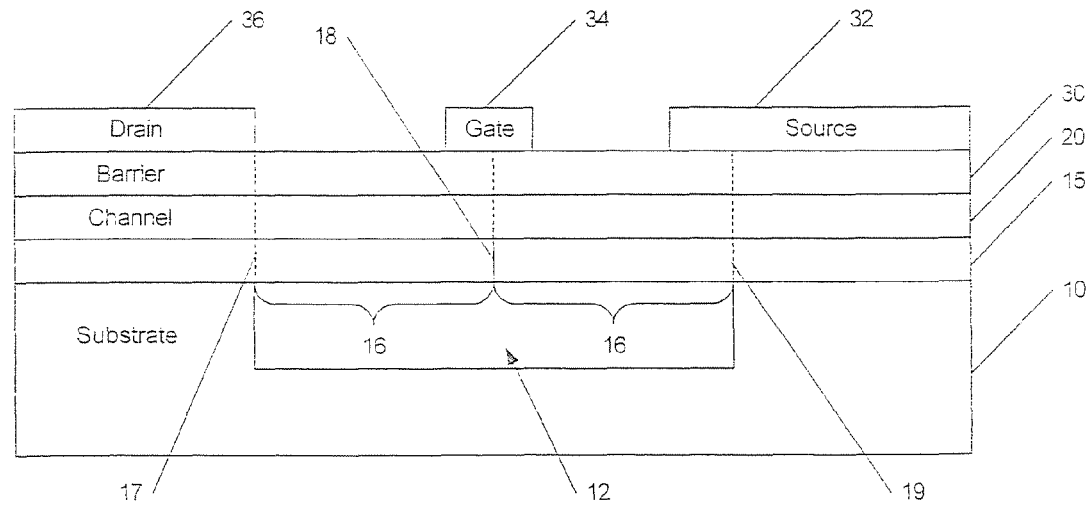

In FIG. 14, the drain contact 36 is provided on the vertically grown portion of the first Group III-nitride layer 15 and extends to but not beyond the boundary 17 between the laterally grown region 16 and the vertically grown region of the first Group III-nitride layer 15. The source contact 32 does not bridge the coalescence region 18. The gate contact 34 is provided on both the laterally grown regions 16 and bridges the coalescence region 18. Thus, the active region of the device in FIG. 14 is provided in two adjacent laterally grown regions 16.

Figure 15:
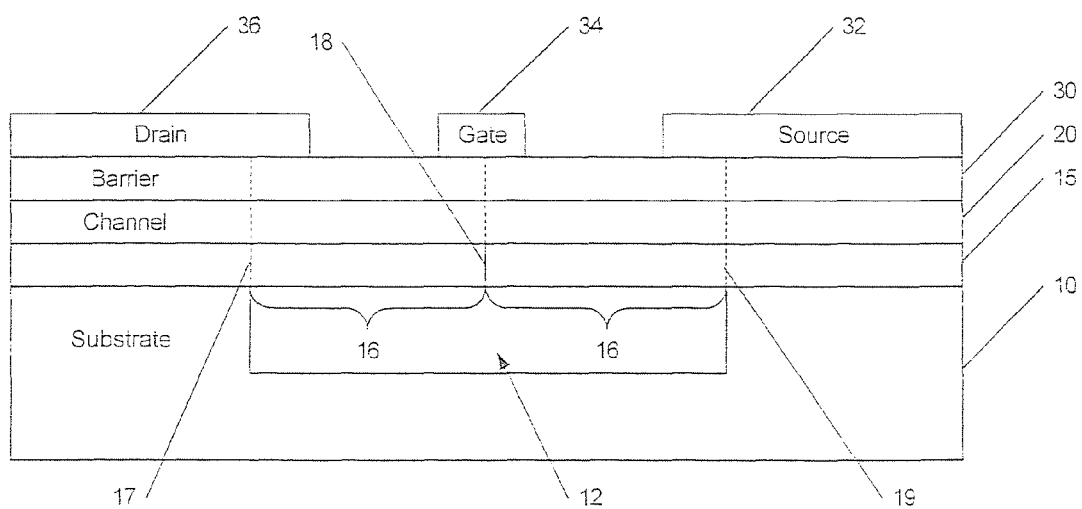

In FIG. 15, the drain contact 36 is provided on the vertically grown portion of the first Group III-nitride layer 15 and extends beyond the boundary 17 between the laterally grown region 16 and the vertically grown region of the first Group III-nitride layer 15. The source contact 32 does not bridge the coalescence region 18. The gate contact 34 is provided on both the laterally grown regions 16 and bridges the coalescence region 18. Thus, the active region of the device in FIG. 15 is provided in two adjacent laterally grown regions 16.

While the embodiments illustrated in FIGS. 1 and 5 through 15 illustrate variations in the gate contact 34, source contact 32 and drain contact 36 placement, additional variations may be provided. For example, the embodiments illustrated in FIGS. 7 through 15 could be provided with the source contact 32 extending to but not beyond the boundary 19 between the laterally grown region 16 and the vertically grown region of the first Group III-nitride layer 15. Likewise, the embodiments illustrated in FIGS. 7 through 15 could be provided with the source contact 32 not extending to the boundary 19 between the laterally grown region 16 and the vertically grown region of the first Group III-nitride layer 15.

While embodiments of the present invention have been illustrated with reference to a particular HEMT structure, other structures that may allow for the formation of the gate over a laterally grown region of a Group III-nitride may also be provided. For example, an insulating layer may be provided between the gate and the barrier layer to provide a MISHEMT. Accordingly, embodiments of the present invention should not be construed as limited to the particular transistor structure described herein.

Furthermore, while embodiments of the present invention have been described with reference to a particular sequence of fabrication steps, a different sequence of steps may be utilized while still falling within the scope of the present invention. Accordingly, embodiments of the present invention should not be construed as limited to the particular sequence of steps described herein.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A high electron mobility transistor, comprising:
   a first Group III-nitride layer having vertically grown regions, laterally grown regions between adjacent vertically grown regions and a coalescence region between adjacent laterally grown regions, wherein the first Group-III nitride layer is provided on a trench wherein the coalescence region is positioned substantially at the center of the trench;
   a Group III-nitride channel layer on the first Group III-nitride layer;
   a Group III-nitride barrier layer on the Group III-nitride channel layer;
   a drain contact on the barrier layer;
   a source contact on the barrier layer; and
   a gate contact on the barrier layer,
   wherein the gate contact is disposed on a portion of the barrier layer on a laterally grown region of the first Group III-nitride layer and at least a portion of one of the source contact and/or the drain contact is disposed on a portion of the barrier layer on a vertically grown region of the first Group III-nitride layer; and
   wherein the trench is oriented with respect to a crystal structure to provide one of a vertical sidewall growth of the laterally grown regions of the first Group III-nitride layer and trapezoidal sidewall growth of the laterally grown regions of the first Group III-nitride layer.

2. The transistor of claim 1, wherein the laterally grown region on which the gate contact is disposed extends toward the drain contact at least as far as a depletion region of a two-dimensional electron gas extends from the gate contact under expected operating conditions.

3. The transistor of claim 1, wherein the laterally grown region on which the gate contact is disposed extends toward the drain contact at least as far as a point where a strength of an electric field is 50% of a strength of an electric field at a drain side edge of the gate contact under expected operating conditions.

4. The transistor of claim 1, wherein the laterally grown region on which the gate contact is disposed extends toward the drain contact at least as far as a point where a strength of an electric field is an order of magnitude less than a strength of an electric field at a drain side edge of the gate contact under expected operating conditions.

5. The transistor of claim 1, wherein the laterally grown region on which the gate contact is disposed extends toward the drain contact at least as far as a point where a strength of an electric field is two orders of magnitude less than a strength of an electric field at a drain side edge of the gate contact under expected operating conditions.

6. The transistor of claim 1, wherein the laterally grown region on which the gate contact is disposed extends toward the drain contact but not to the drain contact such that the drain contact is disposed on a vertically grown region of the first Group III-nitride layer.

7. The transistor of claim 1, wherein the laterally grown region on which the gate contact is disposed extends to but not beyond the drain contact.

8. The transistor of claim 1, wherein the laterally grown region on which the gate contact is disposed extends beyond an edge of the drain contact such that at least a portion of the drain contact is disposed on the laterally grown region on which the gate contact is disposed.

9. A high electron mobility transistor, comprising:

a semiconductor layer defining a trench therein; and a group III-nitride layer on the semiconductor layer, the group III-nitride layer having laterally grown portions that are cantilevered over the trench defining a cavity in the trench between the cantilevered laterally grown portions of the group III-nitride layer and a floor of the trench, wherein the group III-nitride layer further includes vertically grown portions;

wherein the laterally grown portions extend from the vertically grown portions and begin above sidewalls of the trench; and wherein the trench is oriented with respect to a crystal structure to provide one of a vertical sidewall growth of the laterally grown portions of the group III-nitride layer and trapezoidal sidewall growth of the laterally grown portions of the group III-nitride layer, wherein the group III-nitride layer further includes a coalescence region between adjacent laterally grown regions, the transistor further comprising:

a group III-nitride channel layer on the group III-nitride layer;

a group III-nitride barrier layer on the group III-nitride channel layer;

a drain contact on the barrier layer;

a source contact on the barrier layer;

a gate contact on the barrier layer, wherein the gate contact is disposed on a portion of the barrier layer on a laterally grown region of the group III-nitride layer and at least a portion of one of the source contact and/or the drain contact is disposed on a portion of the barrier layer on a vertically grown region of the group III-nitride layer.

10. The transistor of claim 9, wherein the laterally grown portions contact first and second sides of a coalescence region that is positioned substantially in a center portion of the trench.

11. The transistor of claim 9, wherein a depth of the trench is dependent on a width of the trench such that the laterally grown portions coalesce before the trench is filled to provide the cavity between the cantilevered portions of the laterally grown portions of the group III-nitride layer and the floor of the trench.

12. The transistor of claim 11, wherein the width of the trench is about 8.0 µm and the depth of the trench is about 4.0 µm.

13. The transistor of claim 9, further comprising a mask on a floor of the trench to suppress growth within the trench to provide the cavity.

14. The transistor of claim 9, wherein the semiconductor layer comprises a semiconductor substrate.

15. The transistor of claim 14, wherein the semiconductor substrate comprises a silicon carbide substrate.

16. The transistor of claim 14, wherein the trench extends perpendicular or parallel to a crystal plane of the semiconductor substrate.

17. The transistor of claim 16, wherein the trench extends parallel or perpendicular to a plane in the $\{11\bar{2}0\}$ family of planes or the $\{10\bar{1}0\}$ family of planes of the semiconductor substrate.

18. The transistor of claim 14, wherein the trench extends parallel or perpendicular to a major flat of a wafer that provides the semiconductor substrate.

19. The transistor of claim 9, wherein the vertical the sidewall growth is substantially perpendicular to a surface of the semiconductor substrate.

20. The transistor of claim 9, wherein the first group-III nitride layer comprises a gallium nitride based layer.

21. The transistor of claim 9, wherein the semiconductor layer comprises a semiconductor substrate, the transistor further comprising a buffer layer on the semiconductor substrate, wherein the trench is defined by the buffer layer and the semiconductor substrate.

* * * * *